United States Patent [19]
Liu et al.

[11] Patent Number: 6,122,169
[45] Date of Patent: Sep. 19, 2000

[54] HEAT SINK ASSEMBLY

[75] Inventors: Eric Liu, Tu-Chen; Pao Lung Lin; Chun-Hsin Lu, both of Taipei, all of Taiwan

[73] Assignee: Foxconn Precision Components Co., Ltd., Taipei Hsien, Taiwan

[21] Appl. No.: 09/422,136

[22] Filed: Oct. 20, 1999

[30] Foreign Application Priority Data

Jul. 22, 1999 [TW] Taiwan .................................. 88112484

[51] Int. Cl.⁷ ........................................................ H05K 7/20
[52] U.S. Cl. .......................... 361/700; 361/687; 361/695; 361/702; 361/710; 361/802; 361/816; 257/723; 165/109.33; 165/121; 454/184
[58] Field of Search ................................. 361/683, 687, 361/690–695, 697, 699, 700–705, 707, 709, 710, 720–723, 727, 802, 803, 816, 818; 257/706–727; 174/15.1, 16.3, 252; 454/184; 415/115, 177, 178, 208.3, 213.1, 214.1; 165/80.2, 80.3, 80.4, 121, 122, 106, 106.33, 104, 104.32, 104.33, 185

[56] References Cited

U.S. PATENT DOCUMENTS 5,880,930  3/1999  Wheaton ................................. 361/690
5,917,699  6/1999  Hung et al. ............................. 361/697
5,926,370  9/1999  Cromwell ............................... 361/700
5,959,837  9/1999  Yu ........................................... 361/697

FOREIGN PATENT DOCUMENTS 411045967A  2/1999  Japan .......................... H01L 23/467

*Primary Examiner*—Leo P. Picard
*Assistant Examiner*—Michael Datskovsky
*Attorney, Agent, or Firm*—Wei Te Chung

[57] ABSTRACT

A heat sink assembly of the present invention comprises a conductive housing with a heat pipe and a fan fixed therein, and fixing devices. The conductive housing is formed by die-casting and comprises a base, a heat sink portion and a shielding portion which depend downwardly from the square base. The base defines a thorough channel to fix the heat pipe for dissipating heat produced by an electronic element mounted in the shielding portion, two legs of the channel being communication with the space formed by the shielding portion and the heat sink portion respectively. The shielding portion is integral with the heat sink portion and defines a peripheral side wall to form a sealed square-shaped space together with the base to provide EMI shielding for the electronic element. A hole is defined in each of the four corners of the peripheral side wall of the shielding portion to engage with the fixing devices.

20 Claims, 4 Drawing Sheets

HEAT SINK ASSEMBLY

BACKGROUND OF THE INVENTION

The present invention relates to a heat sink assembly, and particularly to a heat sink assembly which can provide EMI shielding for protected electronic elements while providing effective heat dissipation.

Computer technology today transmits information at higher and higher rates. As transmission speed increases, the heat produced by the internal electronic elements increases correspondingly. This heat must be dissipated efficiently, otherwise the rising temperature in the computer will cause a system malfunction.

Referring to U.S. Pat. No. 4,884,331, a prior art heat sink assembly comprises a heat sink having a conductive base. A plurality of fins are formed on a top surface of the base and an electronic element is located under the base and abutted against a bottom surface thereof, whereby heat produced by the electronic element is dissipated through the fins on the base. However, using this means, the assembly is fairly high profile, which does not accord with the low profile development trend in computers, and minimal EMI protection is provided. Additionally, one means commonly used to fix such a heat sink assembly to the chip is similar to the structure shown in U.S. Pat. No. 5,621,615. This means provides an uneven retaining force, and therefore the electronic element may not make effective contact with the heat sink, and heat dissipation may be adversely affected.

Another heat sink assembly is shown in FIG. 4. This heat sink assembly comprises a rectangular shaped base 11, a first heat sink 13 mounted on the base 11, a second heat sink 15 also mounted on the base 11 some distance away from the first heat sink 13 and a heat pipe 17 running beneath the two heat sinks. The heat sink assembly is mounted with the second heat sink 15 directly above the electronic element which is to be cooled. Channels 12 and 16 are defined in the middle positions of the first and the second heat sinks 13, 15 to install the heat pipe 17. A fan 19 is mounted on the first heat sink 13 to improve the effectiveness of the heat sink. Although this heat sink assembly is low profile, product assembly is fairly involved.

In addition, the increasing frequency of the signals used in computers is causing increasingly severe EMI shielding problems, which need to be taken into account. However, the aforementioned heat sink assemblies do not provide effective EMI shielding for the electronic elements.

Therefore, a heat sink assembly which can provide EMI shielding for the protected electronic elements is needed.

BRIEF SUMMARY OF THE INVENTION

A first object of the present invention is to provide a heat sink assembly which can provide EMI shielding for protected electronic elements;

A second object of the present invention is to provide a heat sink assembly which is easily manufactured and has a good heat sink effectiveness.

A third object of the present invention is to provide a heat sink assembly which is retained on the printed circuit board using an even retaining force.

A heat sink assembly of the present invention comprises a conductive housing, a heat pipe and a fan fixed therein, and fixing devices. The conductive housing is integrally formed by die-casting and comprises a rectangular-shaped base, a heat sink portion and a shielding portion which depend downwardly from the base. The shielding portion is integral with the heat sink portion and has a peripheral side wall to form a sealed square-shaped space together with the base for providing EMI shielding for electronic elements mounted therein. A hole is defined in each of four corners of the peripheral side wall of the shielding portion to engage with the fixing devices. The heat pipe is fixed in a channel defined in the base to dissipate heat produced by the electronic elements. The fan is fitted in the heat sink portion to aid in the air circulation between the heat sink portion and outside for cooling the heat sink portion.

Other objects, advantages and novel features of the invention will become more apparent from the following detailed description of the present embodiment when taken in conjunction with the accompanying drawings.

DETAILED DESCRIPTION OF THE INVENTION

Although a heat sink assembly of the present invention may be used with such electronic elements as a CPU, an accelerated graphics chip (AGC) and other components, only a CPU is used as an example in this description of a preferred embodiment.

Figure 1:
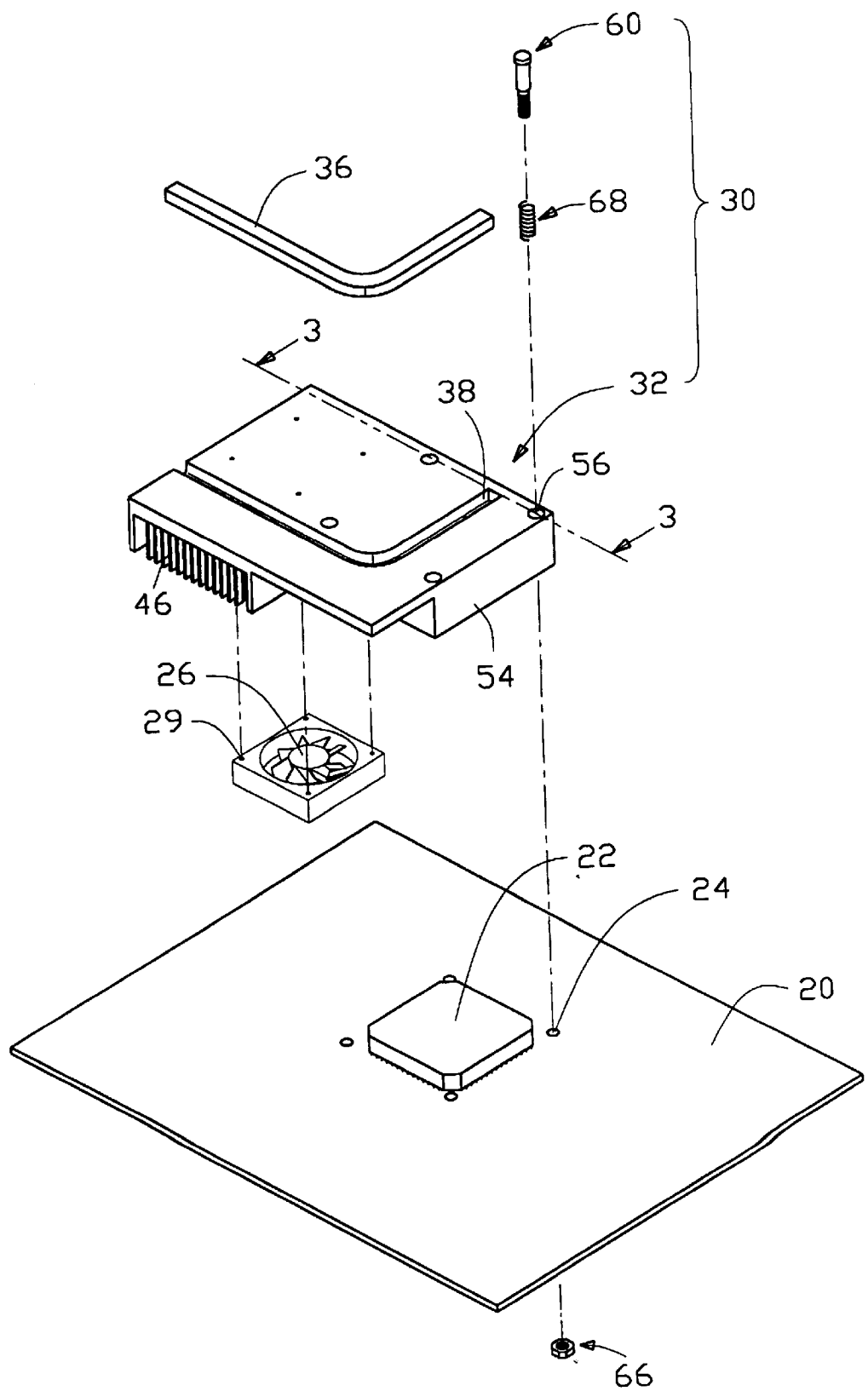
FIG. 1 is an exploded view of a heat sink assembly of the present invention.
Figure 2:
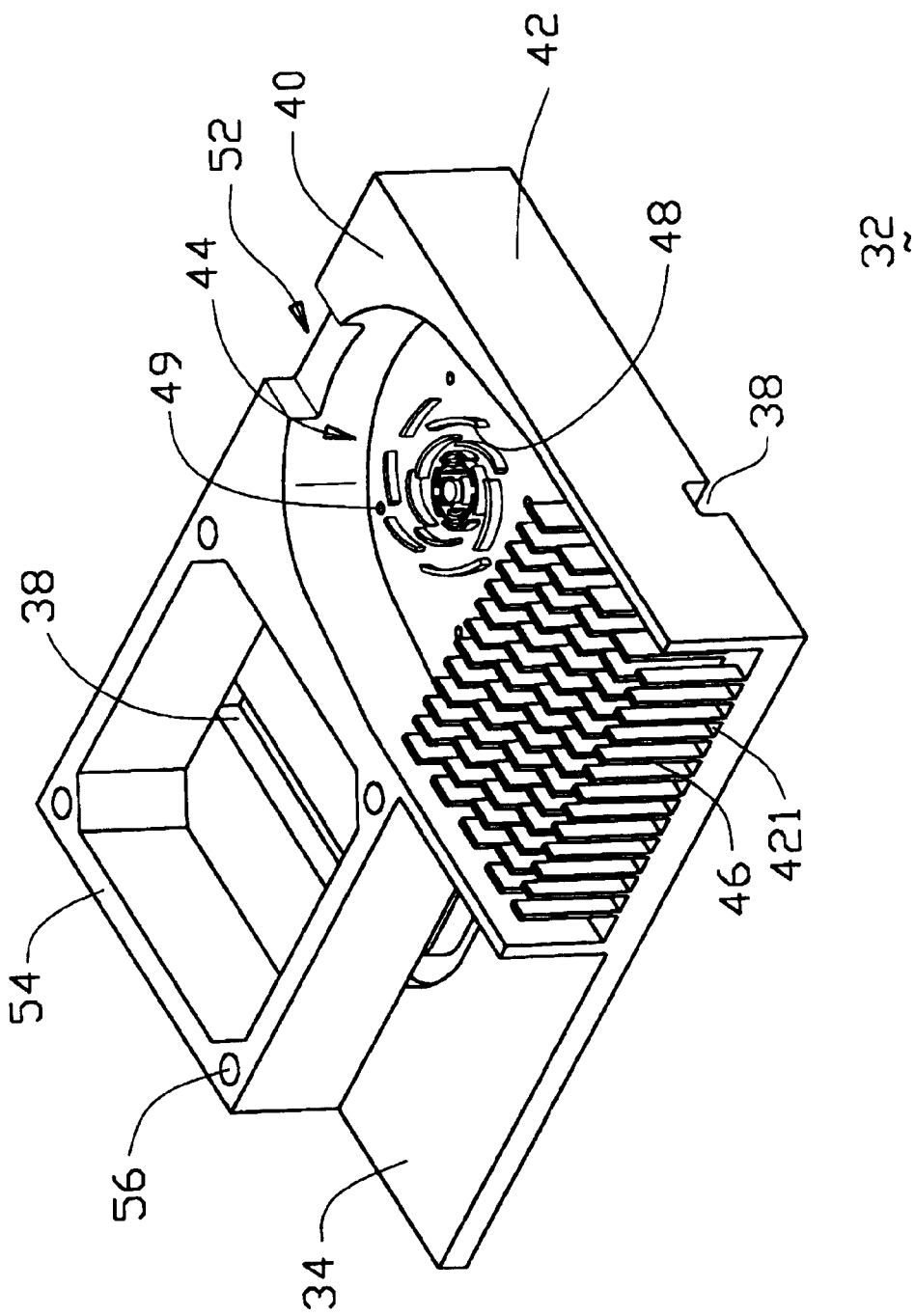
FIG. 2 is a perspective view from another viewpoint of a conductive housing of the present invention.

FIGS. 1, 2 show a heat sink assembly 30 of the present invention for being mounted to a printed circuit board 20 to protect a CPU 22 mounted on the printed circuit board 20. The heat sink assembly 30 of the present invention comprises a conductive housing 32, a heat pipe 36 and a fan 26 mounted therein, and fixing devices (not labeled). The conductive housing 32 is integrally formed by die-casting and comprises a rectangular-shaped base 34, a heat sink portion 40 and a shielding portion 54 which depend downward from the base 34. The heat sink portion 40 defines an arch-shaped space 44 enclosed by a peripheral wall 42. The peripheral side wall 42 has an open end 421 at one end thereof and a cutout 52 defined in the other end thereof opposite to the open end 421. The cutout 52 functions as an inlet for the fan 26. An end portion of the space 44 defines a plurality of fins 46 depending downward from the base 34 adjacent to the open end 421 of the peripheral wall 42. The plurality of fins 46 are arranged in an array and have a uniform height which is substantially equal to that of the peripheral wall 42. The other portion of the space 44 forms a plurality of arc-shaped projections 48 arranged in a rotary configuration to guide the flow of air driven by the fan 26 fixed within the space 44. Four screw holes 49 are defined near the projections 48 and align with four corresponding fixing holes 29 defined in a fan housing (not labeled) of the fan 26 for screws (not shown) extending therethrough to fix the fan 26 in the space 44 of the heat sink portion 40.

The shielding portion 54 of the conductive housing 32 is integral with the heat sink portion 40, its peripheral side wall defining a sealed square-shaped space with the base 34 to provide EMI shielding for the CPU 22 located therewithin. Additionally, the base 34 defines a thorough channel 38 in the shape of the letter "L", two legs of the channel 38 being communication with the shielding portion 54 and the plurality of fins 46 of the heat sink portion 40 respectively. The heat pipe 36 is correspondingly formed in the shape of the letter "L" and is filled with a conductive fluid for dissipating heat from the CPU 22.

Figure 3:
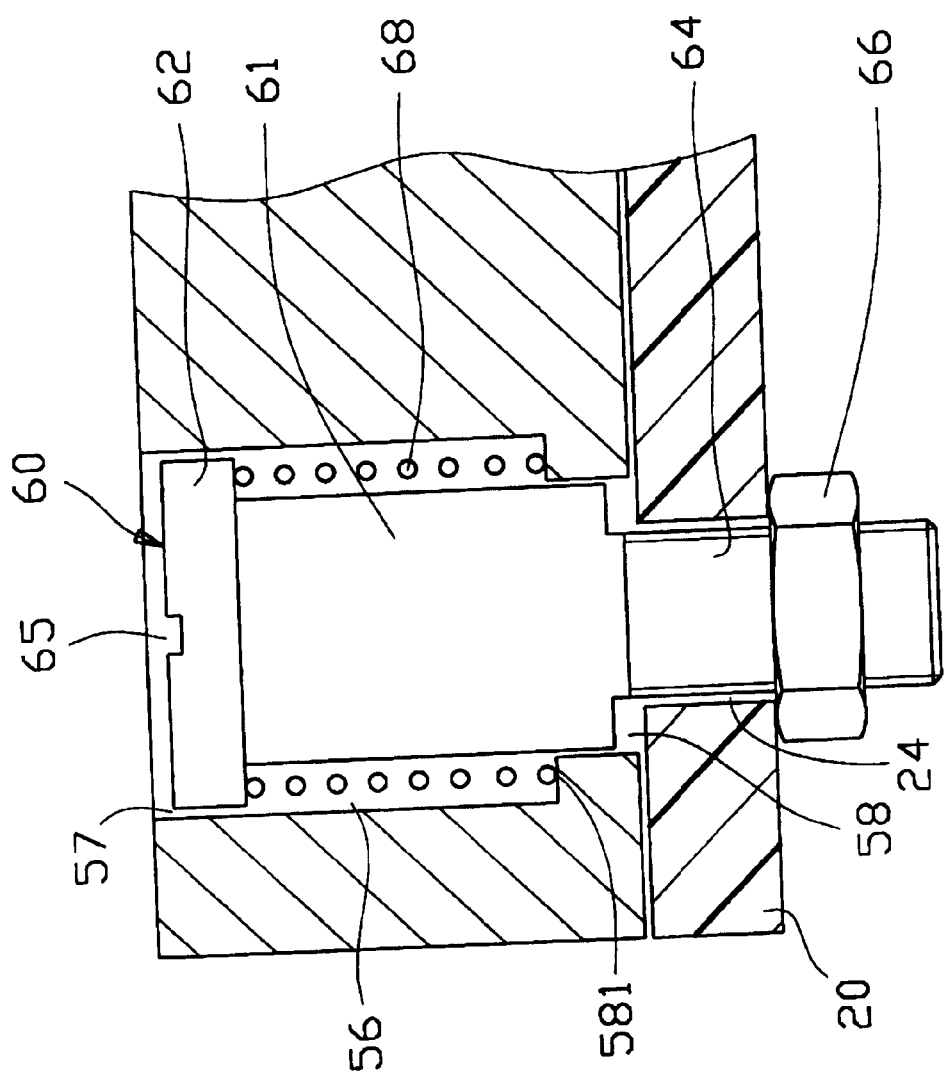
FIG. 3 is a partial sectional view taken at line 3—3 in FIG. 1.
Figure 4:
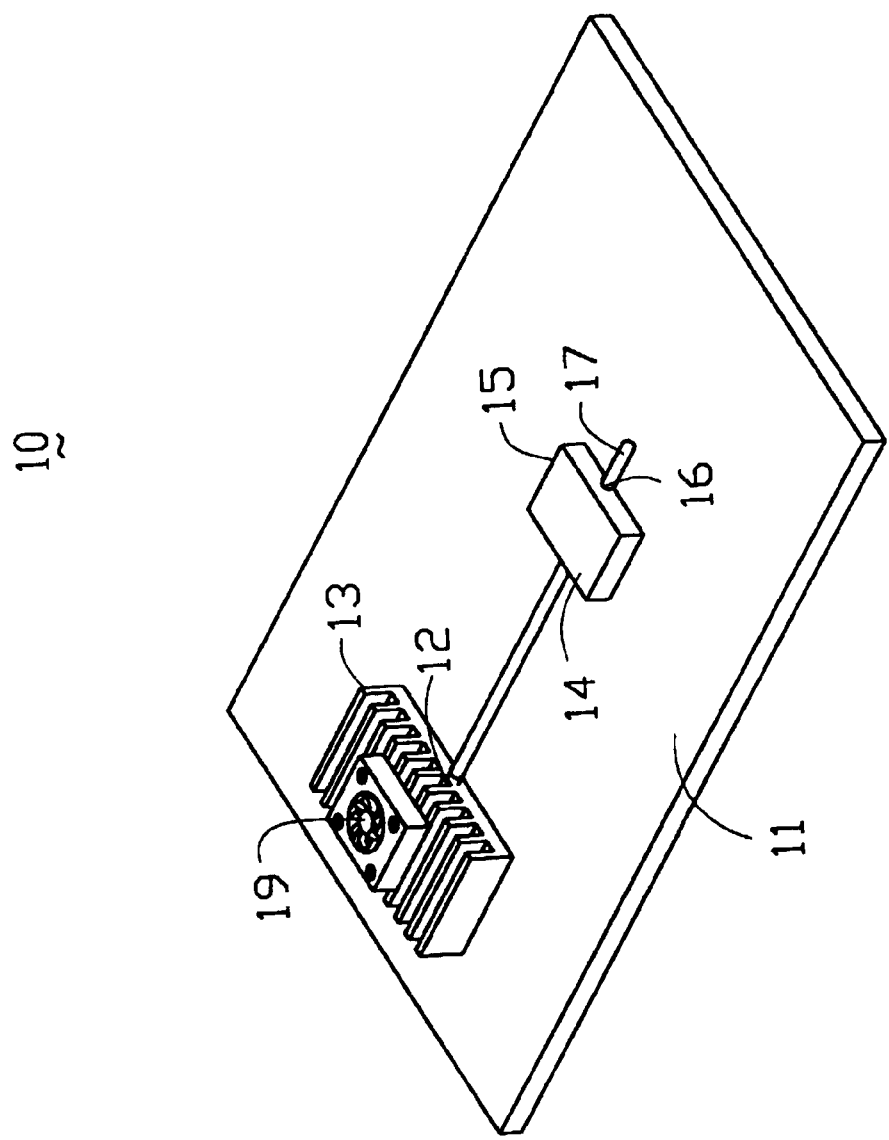
FIG. 4 is a perspective view of a prior art heat sink assembly.

Referring to FIGS. 2, 3, a hole 56 is defined in each of the four corners of the peripheral side wall of the shielding portion 54 for a group of fixing devices to fit in. The holes 56 extend through the base 34 into the corners of the peripheral side walls of the shielding portion 54, and define an upper portion 57 and a lower portion 58. The lower portion 58 thereof is proximate the printed circuit board 20 when the heat sink assembly 30 is mounted to the printed circuit board 20. A lip 581 is formed at the junction of the lower portion 58 and the upper portion 57, the lower portion 58 being of a smaller diameter than the upper portion 57. The group of fixing devices each comprise a bolt 60, a spring 68 and a nut 66. The bolt 60 comprises an end cap 62, a shank 61 and a screw portion 64 in sequence. The end cap 62 defines a recess 65 in a middle portion of a top surface for a screwdriver (not shown) to insert. The diameter of the end cap 62 is slightly smaller than that of the upper portion 57 of the hole 56 to be fully received therein, so as not to be outwardly exposed. The diameter of the shank 61 of the bolt 60 is smaller than that of the end cap 62 and is substantially equal to that of the lower portion 58 of the hole 56. The spring 68 encircles a periphery of the shank 61, two ends of the spring 68 abutting the end cap 62 at an upper end and the lip 581 at a lower end. The screw portion 64 of the bolt 60 extends through a bolt hole 24 defined in the printed circuit board 20 and engages with the nut 66, thereby fixing the heat sink assembly 30 to the printed circuit board 20.

In assembly (referring to FIG. 1), the heat pipe 36 is fixed in the channel 38 of the conductive housing 32 with a conductive adhesive. The fan 26 is fixed with the projections 48 in the space 44 of the heat sink portion 40 with the screws extending through the fixing holes 29 thereof into the screw holes 49 defined in the base 34. The conductive housing 32 combination assembly is then placed on the printed circuit board 20 so that the holes 56 in the housing 32 align with the bolt holes 24 in the printed circuit board 20, so that the shielding portion 54 of the housing 32 encloses the space around the CPU 22, thereby providing EMI shielding. The bolts 60 are inserted through the springs 68 and each of these is inserted into each of the corresponding holes 56 in the conductive housing 32 and then through the bolt hole 24 in the printed circuit board 20, the nut 66 then being engaged and tightened to the bolt 60.

Because the heat sink assembly 30 of the present invention fully encloses the CPU 22, it provides an effective EMI shield. Because the conductive housing 32 of the heat sink assembly 30 is integrally die-cast, the manufacture and assembly of the heat sink assembly 30 are fairly easy. Moreover, the spring 68 of the fixing device provides an even retaining force between the bolt 60 and the heat sink assembly 30, thereby improving the method of fixing over the prior art.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly for protecting an electronic element mounted on a printed circuit board, comprising:
    a conductive housing including:
        a base defining a channel consisted of a first part and a second part,
        a heat sink portion integrally depending downward from the base, the heat sink portion being in contact with one of the first and the second parts of the channel, and
        a shielding portion being integral with the heat sink portion and depending downward from the base, the shielding portion together with the base defining a space for surrounding an electronic element to providing EMI shielding to the electronic element, the space being in communication with the other of the first and the second parts of the channel;
    a group of fixing devices for fixing the conductive housing to a printed circuit board;
    a heat pipe being fixed in the thorough channel of the base for dissipating heat produced by the electronic element; and
    a fan being fitted in the heat sink portion of the conductive housing to generate air circulation between the heat sink portion and outside for aiding in cooling the heat sink portion.

2. The heat sink assembly as claimed in claim 1, wherein the base is substantially rectangular shaped.

3. The heat sink assembly as claimed in claim 1, wherein the heat sink portion and the shielding portion of the conductive housing are integrally formed with the base.

4. The heat sink assembly as claimed in claim 1, wherein the heat sink portion defines a peripheral side wall, an outlet and an inlet.

5. The heat sink assembly as claimed in claim 4, wherein the periphery side wall of the heat sink portion defines an arc-shaped space and a plurality of fins extends from one portion of the arc-shaped space, the fins depending from the base and having a uniform height substantially equal to that of the peripheral side wall.

6. The heat sink assembly as claimed in claim 5, wherein the other portion of the arc-shaped space of the heat sink portion forms a plurality of projections arranged in a rotary configuration to engage with the fan, each of projections being in an arc shape and depending downward from the base.

7. The heat sink assembly as claimed in claim 1, wherein the space of the shielding portion is enclosed by a closed periphery side wall.

8. The heat sink assembly as claimed in claim 7, wherein the closed periphery side wall of the shielding portion is substantially in a square shape.

9. The heat sink assembly as claimed in claim 8, wherein the shielding portion defines a respective hole adjacent to each of four corners of the peripheral side wall thereof.

10. The heat sink assembly as claimed in claim 9, wherein each of the holes of the shielding portion extends through the shielding portion into the base and defines an upper portion and a lower portion smaller than the upper portion in diameter, a lip being formed at a junction of the upper portion and the lower portion.

11. The heat sink assembly as claimed in claim 1, wherein each fixing device comprises a bolt, a spring and a nut enclosing and being fitted with the bolt respectively, and is fixed in respective hole of the shielding portion.

12. The heat sink assembly as claimed in claim 11, wherein the bolt of the fixing device comprises an end cap, a shank and a screw portion.

13. The heat sink assembly as claimed in claim 12, wherein the diameter of the end cap of the bolt is slightly smaller than that of the upper portion of the hole in the shielding portion.

14. The heat sink assembly as claimed in claim 12, wherein the diameter of the shank of the bolt is smaller than that of the end cap and substantially equal to that of the lower portion of the hole of the shielding portion.

15. The heat sink assembly as claimed in claim 12, wherein the spring of the fixing device encloses a periphery of the shank and bears against the end cap of the bolt at an upper free end thereof and the lip of the hole at a lower free end thereof, respectively.

16. The heat sink assembly as claimed in claim 12, wherein the diameter of the screw portion of the bolt is smaller than that of the shank and the screw portion of the bolt has screw threads fitted with the nut of the fixing device.

17. The heat sink assembly as claimed in claim 1, wherein the heat pipe and the channel in the base of the conductive housing are both L-shaped.

18. The heat sink assembly as claimed in claim 1, wherein the fan comprises a fan housing and defines four fixing holes in four corners for respectively aligning with four screw holes defined near the projections in the heat sink portion.

19. An assembly for use within a computer, comprising:
- a printed circuit board with an electronic element mounted thereon;
- a heat sink assembly secured to said printed circuit board, said heat sink assembly including a base with a heat sink portion and a shielding portion thereon;
- said shielding portion including a downward extending peripheral wall defining a circumferentially sealed first space therein between the base and the printed circuit board wherein said electronic element is embedded in said first space;
- said heat sink portion defining a second space with an inlet and an outlet thereabout to communicate with an exterior, a plurality of fins formed in the second space adjacent to the outlet, a fan disposed in the second space adjacent to the second inlet; and
- a heat pipe attached to the base, of which one end extends around the first space to absorb heat generated by the electronic element, and the other end extends around the second space to dissipate said heat through said fins.

20. A heat sink assembly comprising:
- a plate-like base;
- a heat sink portion integrally downward from the base and defining therein a ventilation space with an inlet and an outlet in opposite ends;
- an array of fins formed in the ventilation space adjacent to the outlet;
- a fan disposed in the ventilation space adjacent to the inlet;
- a shielding portion integrally downward from the base and defining a circumferentially sealed space; and
- a heat pipe thermally connected between said ventilation space and said sealed space.

* * * * *